United States Patent
Chang et al.

(10) Patent No.: US 8,171,207 B2
(45) Date of Patent: May 1, 2012

(54) ADAPTIVE HYBRID DENSITY MEMORY STORAGE DEVICE AND CONTROL METHOD THEREOF

(75) Inventors: Li-Pin Chang, Banciao (TW); Ming-Dar Chen, Hsinchu (TW)

(73) Assignee: A-Data Technology Co., Ltd., Taipei (TW)

( * ) Notice: Subject to any disclaimer, the term of this patent is extended or adjusted under 35 U.S.C. 154(b) by 896 days.

(21) Appl. No.: 12/216,181

(22) Filed: Jul. 1, 2008

(65) Prior Publication Data
US 2009/0100244 A1 Apr. 16, 2009

(30) Foreign Application Priority Data
Oct. 15, 2007 (TW) .................... 96138438 A

(51) Int. Cl.
G06F 12/00 (2006.01)
G06F 13/00 (2006.01)
G06F 13/28 (2006.01)
G11C 11/34 (2006.01)
G11C 16/04 (2006.01)

(52) U.S. Cl. ............... 711/103; 711/115; 365/185.33; 365/185.02; 365/185.29

(58) Field of Classification Search .............. None
See application file for complete search history.

(56) References Cited

U.S. PATENT DOCUMENTS

| | | | |
|---|---|---|---|
| 5,930,167 A * | 7/1999 | Lee et al. | 365/185.03 |
| 2005/0144367 A1* | 6/2005 | Sinclair | 711/103 |
| 2006/0026372 A1* | 2/2006 | Kim et al. | 711/160 |
| 2008/0172521 A1* | 7/2008 | Lee | 711/103 |

* cited by examiner

Primary Examiner — Yaima Campos
(74) Attorney, Agent, or Firm — Rosenberg, Klein & Lee

(57) ABSTRACT

The present invention discloses a control method of an adaptive hybrid density memory storage device suitable for locating a data to the storage device. The storage device includes a high density memory unit and a low density memory unit. The method is characterized in that the property of the data is determined by its length, and the data is written to the high density memory unit or the low density memory unit according to the property of the data and the relative wearing rate and the amount of data processed by the storage device.

15 Claims, 6 Drawing Sheets

ADAPTIVE HYBRID DENSITY MEMORY STORAGE DEVICE AND CONTROL METHOD THEREOF

BACKGROUND OF THE INVENTION

1. Field of the Invention

The present invention is a storage device, and more particularly a hybrid density memory storage device and a control method thereof.

2. Description of Related Art

Non-volatile memory is used to store data and is always applied to storage devices, such as memory cards, USB flash drives or solid state disk drives. Flash memory has the advantages of high storage density, low power consumption, effective access efficiency and reasonable price, so that it has become the main stream.

The general non-volatile memory usually adopts MLC (Multi-Level Cell) memory or SLC (Single-Level-Cell) memory, wherein the memory made by MLC is high density memory and the memory made by SLC is low density memory. Compared with the low density memory, the data storage capacity per unit area of the high density memory can be multiple, so that the high density memory leads to highly improved storage capacity and reduced cost. However, the time for reading/writing data, executing burning and erasing becomes longer. Besides, the manufacturing technology of the MLC also makes the high density memory to bear fewer erase cycles, so as to influence the data access speed and life time of the storage device with high density memory.

Since the characteristics of the high density memory are high storage capacity and low cost but slow speed for accessing data and fewer erase cycles, and the characteristics of the low density memory are fast speed for accessing data and more erase cycles but small storage capacity and high cost, a memory simultaneously possesses two kinds of densities is developed, namely, a hybrid density memory.

Currently, the hybrid density memory storage device uses low density memory to record data which is often used and high density memory to record large amounts of data. Thus, it has become an issue of research how to simply and rapidly recognize the property of writing data from the host so as to direct the data to be stored in the proper memory. Furthermore, since the low density memory has the characteristics of higher cost and smaller storage capacity, it is also a problem how to plan a data processing method effectively such that the low density memory stores the data which is often used and the older data which is rarely used is eliminated as far as possible. Finally, because the erase cycles of memories in different densities are different, and when the data stored in the memory is updated or accessed, the blocks will be erased which might cause non-average erasing numbers, it will lead to the problem that one memory reaches the erase limit earlier than the other memory, so that the storage device prematurely becomes unusable.

SUMMARY OF THE INVENTION

In the hybrid memory storage device, the data which is frequently accessed and updated is called hot data and will be located in the low density memory for accessing rapidly, and the data which is not frequently used is called cold data and will be located in high density memory. When accessing data, the initial address and the length of the data will be provided and the data which is accessed frequently has a shorter data length, so that the present invention utilizes the data length to judge the property of each writing data for deciding to record the writing data in the proper memory, and then, the erase cycles of the high and low density memories are further analyzed for adjusting the location for storing the writing data, so as to achieve the efficacy of balancing the memory erase cycle.

Consequently, the object of the present invention is to provide an adaptive hybrid density memory storage device and a control method thereof, so as to simply and rapidly recognize the property of the writing data.

Another object of the present invention is to provide an adaptive hybrid density memory storage device and a control method thereof, so that when locating the writing data to the memory, the purpose of balancing erase cycles can be achieved, so as to increase the life time of the hybrid density memory storage device and also prevent the storage resource from being wasted.

Another object of the present invention is to provide an adaptive hybrid density memory storage device and a control method thereof, so that when locating the writing data to the memory, the memory data can be effectively processed, so as to improve the data storage efficiency.

The present invention discloses a control method of an adaptive hybrid density memory storage device suitable for locating a writing data from a host into a hybrid density storage device, wherein the hybrid density storage device includes a high density memory unit and a low density memory unit. The method includes steps of: executing a hot data filter procedure, wherein the length of the writing data is compared with a threshold for recognizing the property of the writing data; and deciding the location of the writing data according to the comparison result, wherein if the data length of the writing data is shorter than the threshold, the writing data is located into the low density memory unit, otherwise, the writing data is located into the high density memory unit.

The present invention further discloses a control method of an adaptive hybrid density memory storage device suitable for locating a writing data from a host into a hybrid density storage device, wherein the hybrid density storage device includes a high density memory unit and a low density memory unit. The method includes steps of: executing a hot data filter procedure, wherein the length of the writing data is compared with a threshold for recognizing the property of the writing data; deciding the location of the writing data according to the comparison result, wherein if the length of the writing data is shorter than the threshold, the writing data is located into the low density memory unit, otherwise, the writing data is sent to a adapting unit; and executing an adapting procedure, wherein a wearing rate and a data processing amount of the lower density memory unit and those of the high density memory unit are analyzed for deciding the location for recording the writing data.

The present invention further discloses a control method of an adaptive hybrid density memory storage device suitable for locating a writing data from a host into a hybrid density storage device, wherein the hybrid density storage device includes a high density memory unit and a low density memory unit. The method includes steps of: transmitting the writing data to an adapting unit for executing an adapting procedure, wherein a wearing rate and a data processing amount of the lower density memory unit and those of the high density memory unit are analyzed for deciding the location for recording the writing data.

The present invention further discloses an adaptive hybrid density memory storage device suitable for accessing a writing data from a host. The adaptive hybrid density memory storage device includes a non-volatile memory unit, a hot data filter unit and an adapting unit, wherein the non-volatile memory unit includes a low density memory unit, which is constituted by low density memories, and a high density memory unit, which is constituted by high density memories, the hot data filter unit receives the writing data and compares the data length of the writing data with a threshold so as to recognize the property of the writing data, and the adapting unit is coupled between the hot data filter unit and the non-volatile memory unit for receiving the writing data and locating the writing data into the high density memory unit or the low density memory unit of the hybrid density storage device according to a comparison result of a wearing rate and a data processing amount of the low density memory unit with those of the high density memory unit. Thereby, according to the transmission direction of the writing data, a first address converting unit can be selected to map the logic address of the writing data into a first physical address of the low density memory unit or a second address converting unit can be selected to map the logic address of the writing data into a second physical address of the high density memory unit, so as to locate the writing data into the mapped physical address.

BRIEF DESCRIPTION OF THE DRAWINGS

The foregoing aspects and many of the attendant advantages of this application will be more readily appreciated as the same becomes better understood by reference to the following detailed description, when taken in conjunction with the accompanying drawings, wherein.

DETAILED DESCRIPTION OF PREFERRED EMBODIMENTS

The adaptive hybrid density memory storage device and the control method thereof of the present invention can recognize the property of a writing data from a host and propose a method for processing memory data and a mechanism for averagely erasing the memory, so as to increase the life time and also improve the using efficiency.

Figure 1:
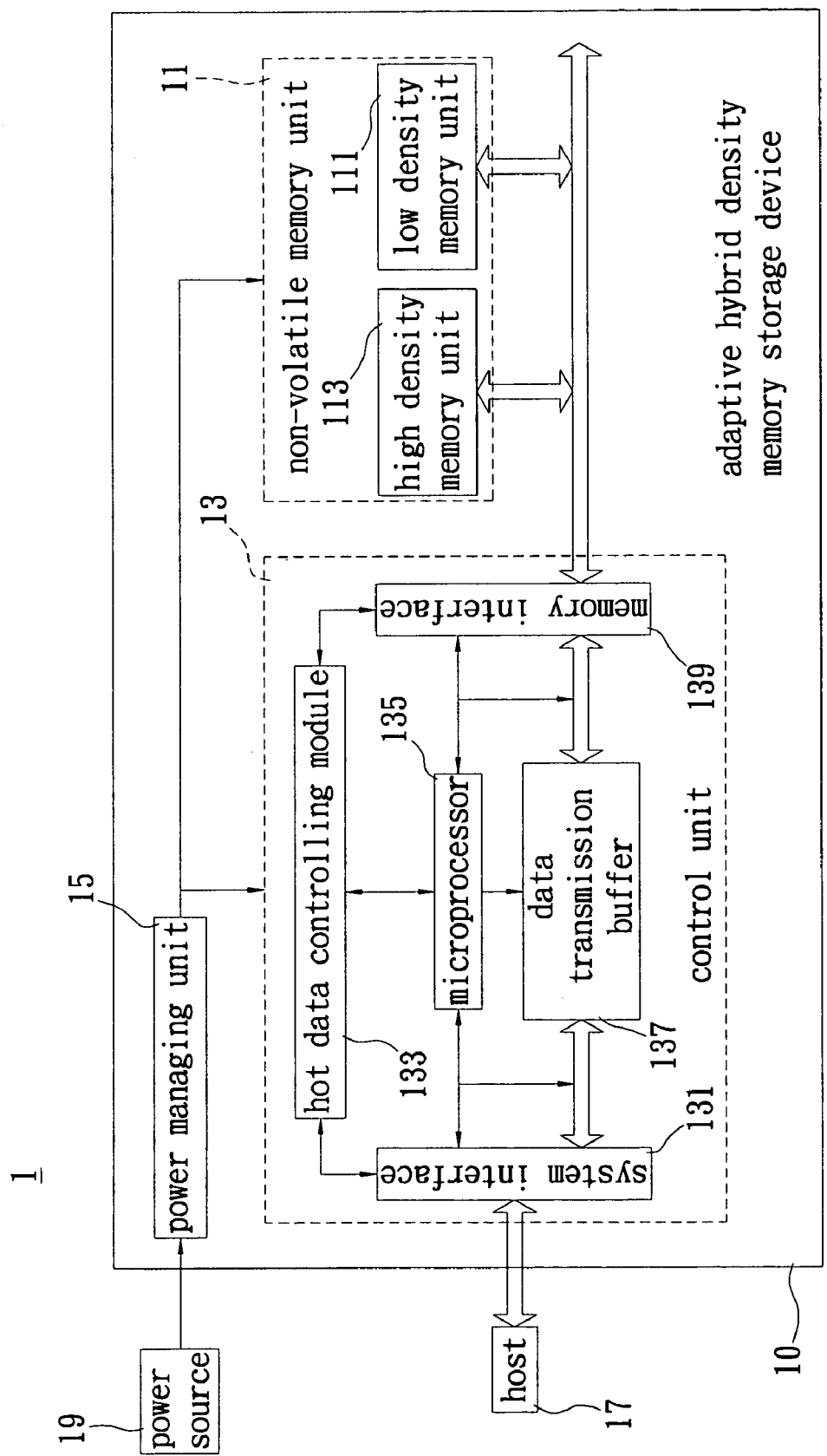
FIG. 1 is a schematic view showing the system architecture of an adaptive hybrid density memory storage device according to the present invention.

First, please refer to FIG. 1, which is a schematic view showing the system architecture of an adaptive hybrid density memory storage device according to the present invention. As shown in FIG. 1, an adaptive hybrid density memory storage device 10 (herein after, the storage device) is applied to a digital system 1 for executing data write/read. In the digital system 1, the storage device 10 is coupled to the host 17 for receiving the commands from the host 17. Specifically, the host 17 is a computing system, and the storage device 10 is the solid state hard disk drive.

The storage device 10 includes a non-volatile memory unit 11, a control unit 13 and a power managing unit 15. The non-volatile memory unit 11 is constituted by flash memories, including a low density memory unit 111 and a high density memory unit 113, wherein the low density memory unit 111 is constituted by low density memories and the high density memory unit 113 is constituted by high density memories. The low density memory can be SLC (single-level-cell) memory, PCM (phase change memory), FeRAM (ferroelectric random access memory) or MRAM (magnetic random access memory). The high density memory can be MLC (multi-level cell) memory. The low density memory is characteristic of low storage capacity per unit, high erase tolerance and fast data access speed, and the high density memory is characteristic of high storage capacity, low erase tolerance and low data access speed.

The power managing unit 15 is coupled to a power source 19 for receiving the electricity outputted by the power source 19 and for converting the electricity into the power needed by the control unit 13 and the non-volatile memory unit 11.

The system architecture of the present invention used for managing the data stored in the storage device 10 is based on FAT12, FAT16, FAT32 or NTFS. An address converting table pre-planned by the firmware of the microprocessor 135 is used for mapping the address of the logical block in the system to the physical address of the non-volatile memory unit 11.

The control unit 13 is coupled between the host 17 and the non-volatile memory unit 11 for receiving a command from the host 17. Here, the command can be a writing command or a reading command, wherein the writing command is for writing a data corresponding to a logic block address into the non-volatile memory unit 11, and the reading command is for reading out a data of a logic block address from the non-volatile memory unit 11. The control unit 13 includes a system interface 131, a hot data controlling module 133, a microprocessor 135, a data transmission buffer 137 and a memory interface 139. The system interface 131 is coupled to the host 17 for receiving the command from the host 17 and for transmitting the data corresponding to the command. The hot data controlling module 133 is coupled to the system interface 131 for recognizing the property of the data indicated by the command and then indicating the data to a proper memory according to the erase degree and data amount of the non-volatile memory unit 11. The microprocessor 135 is coupled to the system interface 131 and the hot data controlling module 133, for controlling the operation of each unit in the storage device 10 related to the command. When the microprocessor 135 receives the command, it transmits the data indicated by the command to the hot data controlling module 133 for judging the property of the data, and then properly processes the data according to the judged result. The data transmission buffer 137 is coupled to the system interface 131 for temporarily storing the data which is transmitted from the host 17 to the storage device 10, or the data which is prepared to be read by the host 17 from the storage device 10. The memory interface 139 is coupled between the data transmission buffer 137 and the non-volatile memory unit 11 for transmitting data between control unit 13 and the non-volatile memory unit 11.

Figure 2:
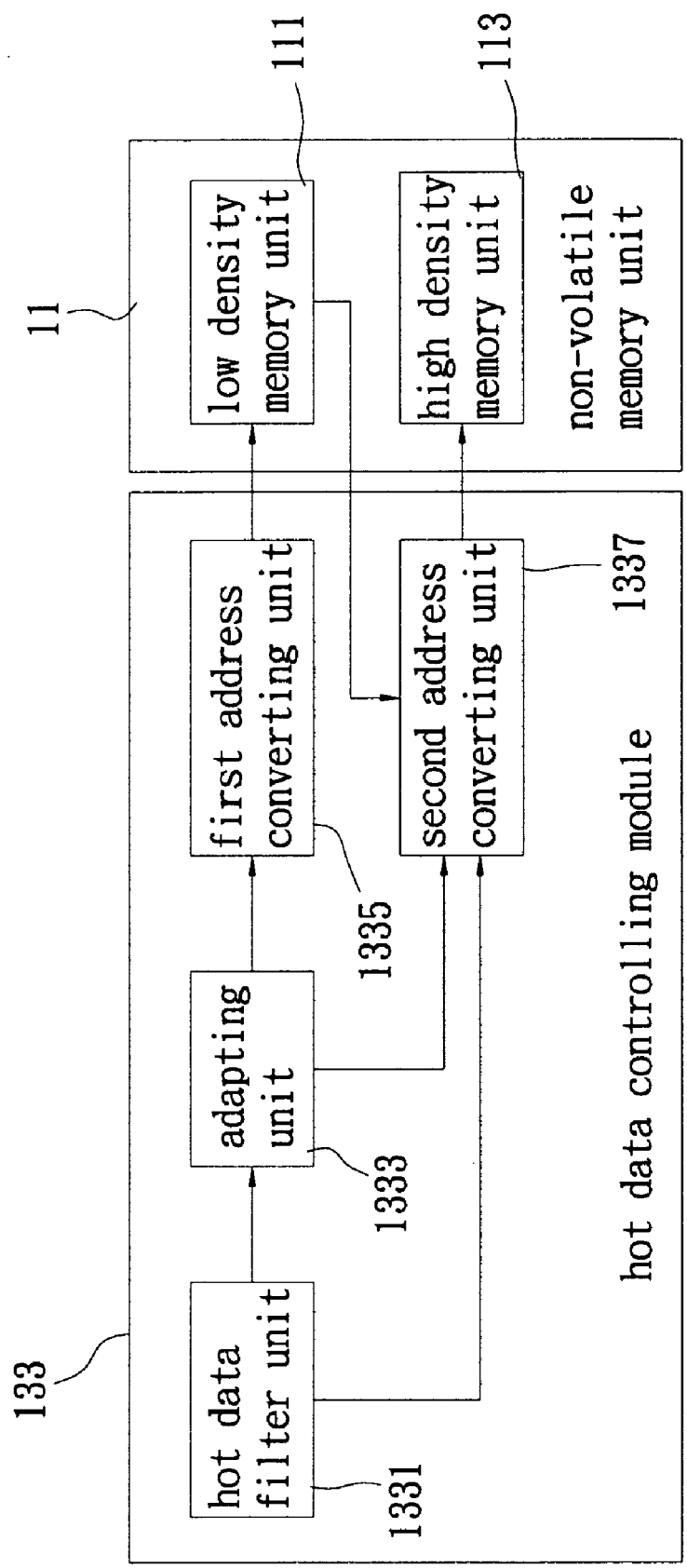
FIG. 2 is a schematic view showing the system architecture of a hot data controlling module in an embodiment according to the present invention.

Then, please refer to FIG. 1 and FIG. 2, which is a schematic view showing the system architecture of the hot data controlling module in an embodiment according to the present invention. As shown in FIG. 2, the hot data controlling module 133 is coupled to the non-volatile memory unit 11 which has a low density memory unit 111 and a high density memory unit 113. The host 17 transmits the data corresponding to the command (hereinafter, the writing data) to the hot data controlling module 133, and according to the property of the writing data and the data processing of the memory, the hot data controlling module 133 indicates whether to write the writing data to the low density memory unit 111 or to the high density memory unit 113.

The hot data controlling module 133 includes a hot data filter unit 1331, an adapting unit 1333, a first address converting unit 1335 and a second address converting unit 1337. The hot data filter unit 1331 receives the writing data and recognizes the data property through the length thereof. The adapting unit 1333 is coupled between the hot data filter unit 1331 and the non-volatile memory unit 11 for receiving the writing data, and then it compares the wearing rate and the data amount in processing between the low density memory unit 111 and the high density memory unit 113 for deciding the destination of the writing data is low density memory unit 111 or the high density memory unit 113. Thereby, according to the transmission direction of the writing data, a first address converting unit 1335 is selected to map the logic address of the writing data into a first physical address in the low density memory unit 111, or a second address converting unit 1337 is selected to map the logic address of the writing data into a second physical address in the high density memory unit 113, and then, the writing data is written to the mapped physical address.

Figure 3:
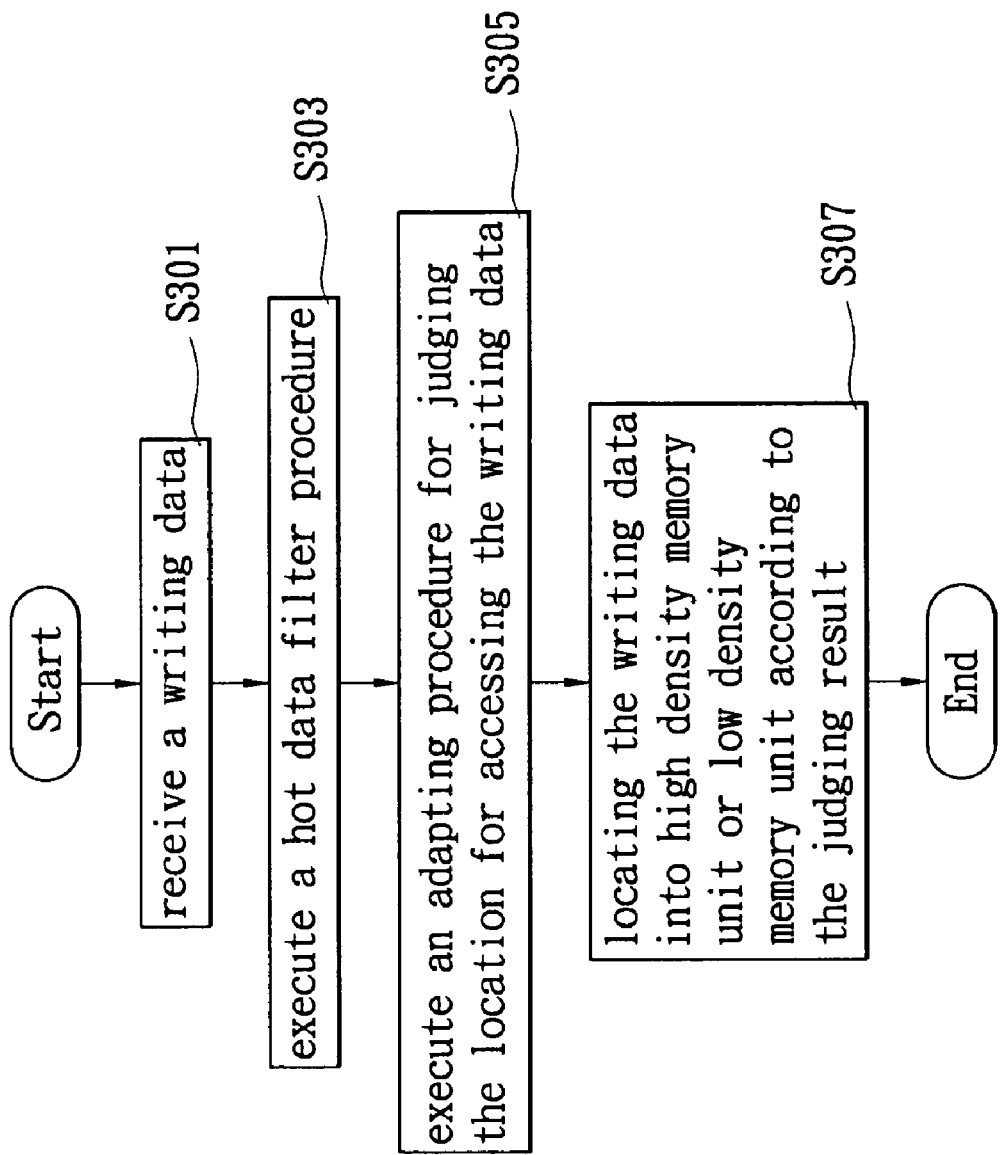
FIG. 3 is a flow chart showing a control method of the adaptive hybrid density memory storage device in an embodiment according to the present invention.

Please refer to FIG. 3, which is a flow chart showing a control method of the adaptive hybrid density memory storage device in an embodiment according to the present invention, and please also refer to FIG. 2 for realizing the related system architecture. As shown in FIG. 3, the control method includes steps as followed:

First, the hot data filter unit 1331 receives a writing data (S301);

Then, a hot data filter process is executed (S303) for comparing the length of the writing data with a threshold, so as to identify the property of the writing data. If it is decided that the writing data is hot data, the writing data is transmitted to the adapting unit 1333;

Continuously, an adapting procedure is executed for analyzing the wearing rate and the amount of the processed data of the non-volatile memory unit 11, so as to decide that the writing data is transmitted to the low density memory unit 111 or the high density memory unit 113 (S305); and Finally, the writing data is selectively written into the low density memory unit 111 or the high density memory unit 113 according to the transmission direction thereof (S307).

Figure 4:
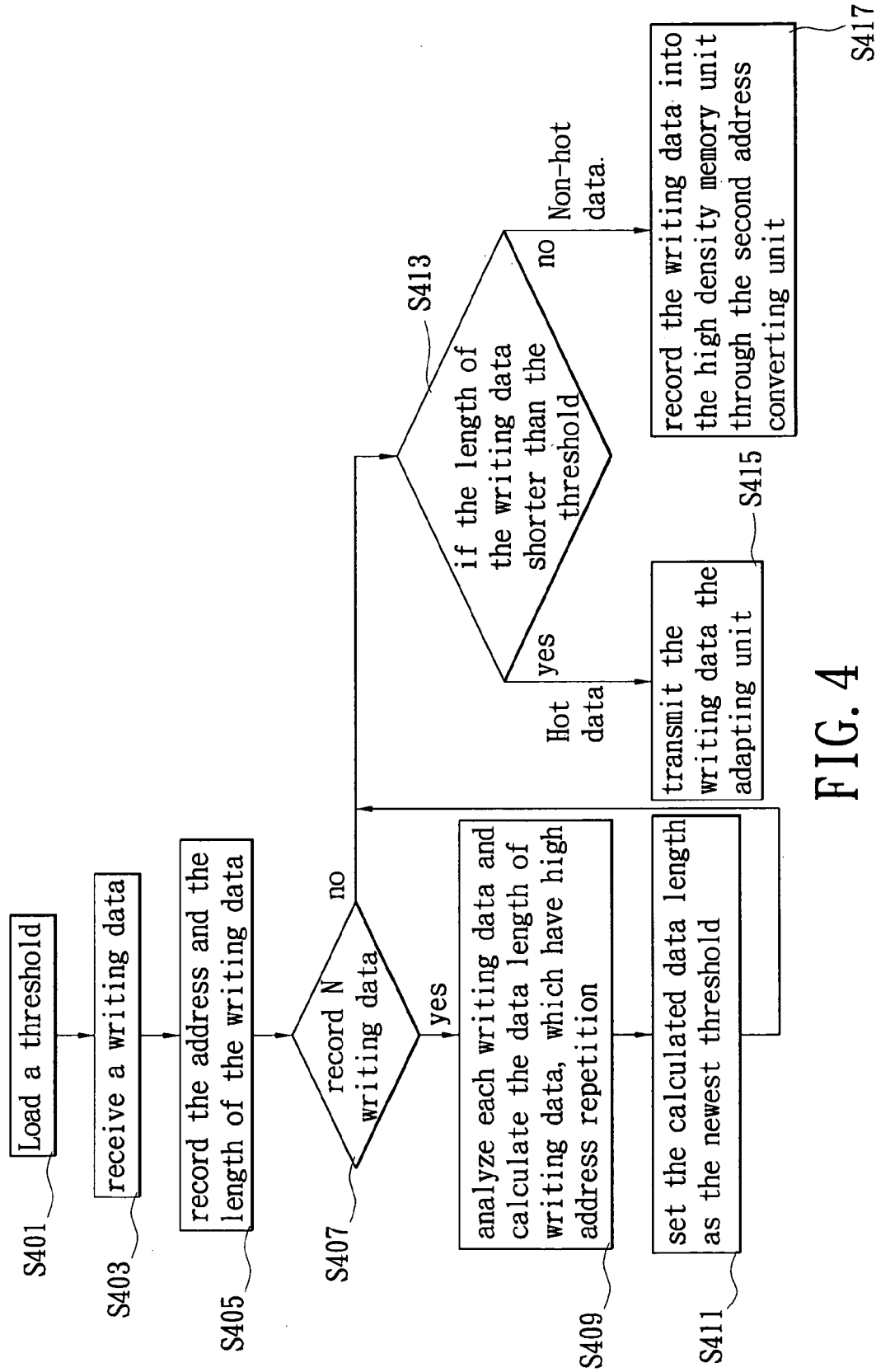
FIG. 4 is a flow chart showing a hot data filter procedure in an embodiment according to the present invention.

Please refer to FIG. 4, which is a flow chart showing the control method of the adaptive hybrid density memory storage device in an embodiment according to the present invention. Specifically, FIG. 4 shows the flow path of the hot data filter unit 1331 executing the hot data filter procedure in a writing mode. Please also refer to FIG. 2 for realizing the related system architecture.

In the present invention, the length of the writing data is compared with a threshold for deciding the property of the writing data. The threshold can be a system default value or can be a value set by the user, and also can be adjusted according to the property of the writing data. For example, the hot data filter unit 1331 can gather and calculate the addresses and lengths of passed N writing data, and then analyze the length range of the address of the data which is repeated frequently. Supposed that the length of the data with higher address repetition is under 2KB, and then the threshold can be set as 2KB, so that if the incoming writing data has a length shorter than 2KB, it is classified as hot data, and if not, it is classified as non-hot data. Moreover, the threshold can be altered every N writing data, that is, after receiving N writing data and analyzing the threshold, a new threshold be regenerated every M incoming writing data (N≠M, N, M☐1), so that the hot data definition can be dynamically adjusted through the gathering and calculation of the writing data. If the storage device 10 is just under operating, and the threshold is not yet produced, an initial threshold can be preset in the hot data filter unit 1331 or a threshold which is recorded as previous usage can be loaded, for judging the data property of initial writing data.

As shown in FIG. 4, in the writing mode, this control method includes steps as followed:

First, the hot data filter unit 1331 loads a threshold (S401), receives the writing data (S403), records the address and length of the writing data (S405) and judges if there has already N writing data been record (S407). If the judging result in S407 is negative, then it decides if the length of writing data is shorter than the threshold (S413). If the judging result in S407 is positive, the currently accumulated N writing data are analyzed for calculating the length of writing data with high address repetition (S409), and then, the calculated data length is set as the threshold (S411). Continuously, it decides that if the length of the incoming writing data is shorter than the threshold (S413). If the judging result in S413 is positive, which means the incoming writing data is a hot data, then it is transmitted to the adapting unit 1333 (S415). If the judging result in S413 is negative, which means the incoming writing data is not a hot data, then it is recorded in the high density memory unit 113 through the second address converting unit 1337 (S417).

Figure 5:
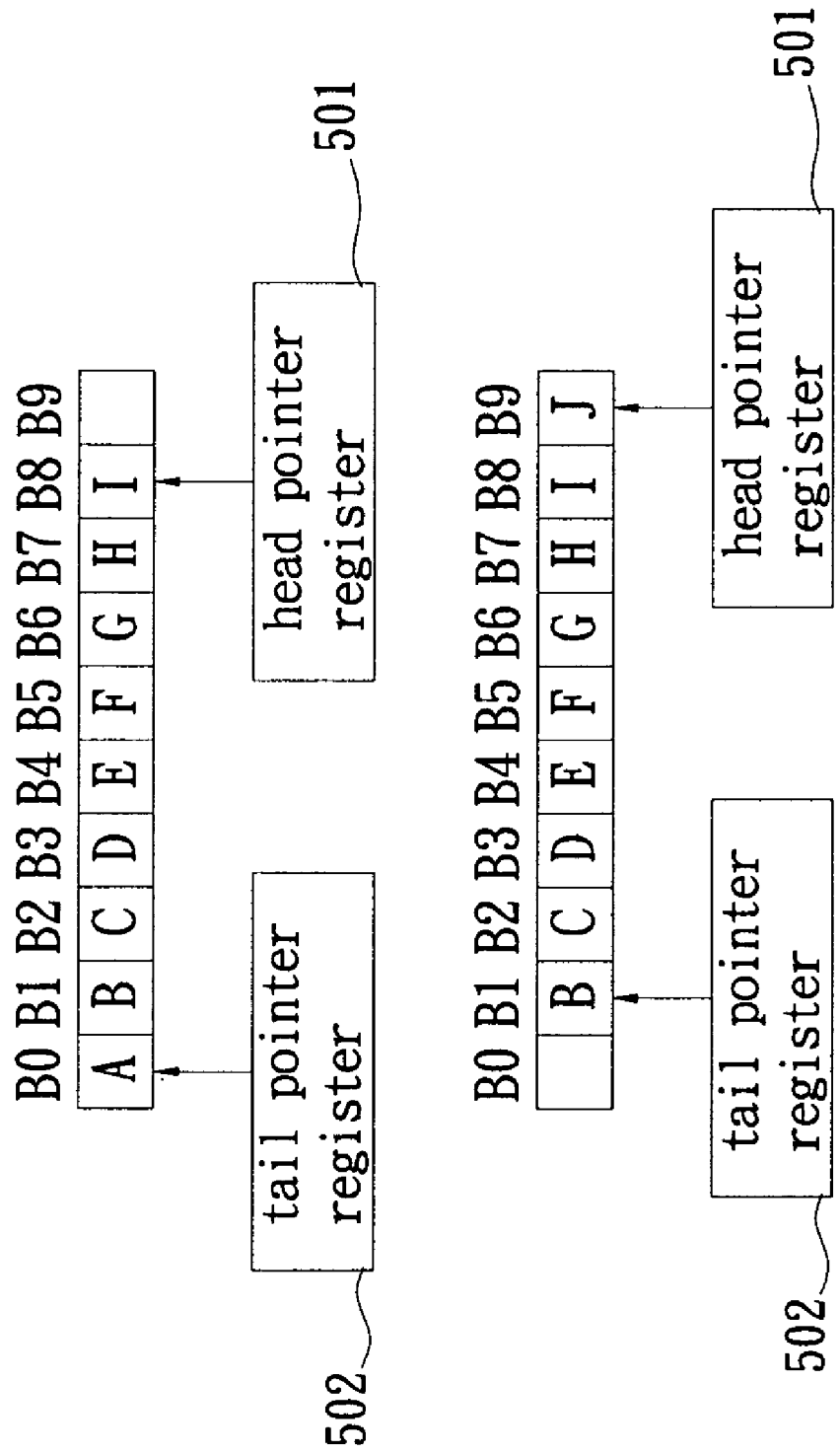
FIG. 5 is a schematic view showing the data processing in the memory of the adaptive hybrid density memory storage device in another embodiment according to the present invention.

Please refer to FIG. 5, which is a schematic view showing the data processing in the memory of the adaptive hybrid density memory storage device in another embodiment according to the present invention. Please also refer to FIG. 2 for realizing the related system architecture.

The low density memory unit 111 defines plural continuous blocks and defines a valid block range therefrom for storing the valid hot data, wherein the data is written into the valid block sequentially. Here, the contents stored in a head pointer register 501 is directed to a block address for storing the newest written hot data, and the contents stored in an tail pointer register 502 is directed to a block address for storing the oldest written hot data. The low density memory unit 111 can be regarded as a cyclical recording space, wherein the new hot data is sequentially written into the block directed by the head pointer register 501, and simultaneously, the block directed by the tail pointer register 502 is sequentially erased. When the data is written in one end of the block, the contents in the register is set to direct to another end of the block for averaging the erase.

The cyclic recording mode for processing data in the low density memory unit 111 is shown in FIG. 5. Supposed that the low density memory unit 111 includes 10 blocks B0~B9 and 9 blocks are defined to record hot data A~I, namely, blocks B0~B9 are the valid block range described above. The hot data A~I are sequentially written into the blocks B0~B8, wherein data A in block B0 is the oldest data and data I in block B8 is the newest data, and at this time, the tail pointer register 502 is directed to block B0 and the head pointer register 501 is directed to block B8. Then, if one data J is incoming, the head pointer register 501 will direct to block B9 and record data J therein, and at the same time, block B0 directed by the tail pointer register 501 is erased and the tail pointer register 502 is redirected to block B1. In the step of erasing block B0, in the beginning, it will judge that if the originally stored data A is also preserved in other valid blocks. If yes, data A is directly erased, and if not, data A is moved to the high density memory unit 113 first. Therefore, before writing data J, the valid block range is blocks B0~B8, and after writing data J, the valid block range is blocks B1~B9, that is, the valid block range is moved forward, but the range extent remains identical.

Figure 6:
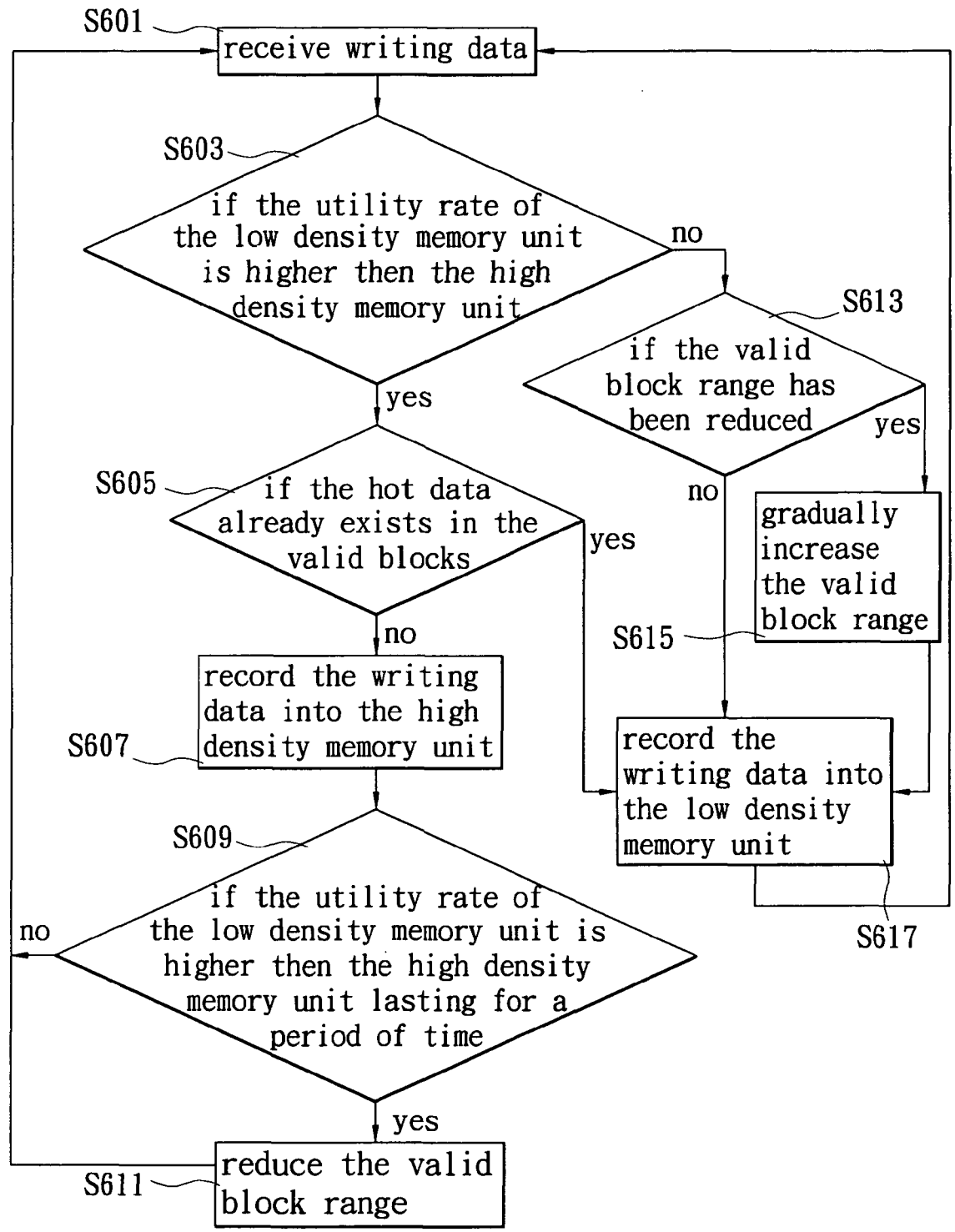
FIG. 6 is a flow chart showing an adapting procedure in an embodiment according to the present invention.

Please refer to FIG. 6, which is a flow chart showing the control method of the adaptive hybrid density memory storage device in another embodiment according to the present invention. Specifically, FIG. 6 shows the flow path of the adapting unit 1333 executing the adapting procedure in the writing mode. Please also refer to FIG. 2, FIG. 4 and FIG. 5 for realizing the related system architecture. As shown in FIG. 6, in the writing mode, the control method includes steps as followed:

After executing the procedure shown in FIG. 4, the adapting unit 1333 receives the writing data which is classified as hot data (S601), and then judges if the low density memory unit 111 has a higher wearing rate than the high density memory unit 113 (S603). If the judging result in S603 is positive and the writing data is also not recorded in the valid blocks (S605), which means the writing data is not accessed or updated for at least a period of time, then it decides that the possibility of the writing data belonging to non-hot data is much higher, so that the adapting unit 1333 records the writing data into the high density memory unit 113 through the second address converting unit 1337 (S607). If it decides in S605 that the writing data is already recorded in the valid blocks, which means the writing data is recently accessed or updated, then the possibility of the writing data belonging to hot data is much higher, so that the adapting unit 1333 records the writing data into the low density memory unit 111 through the first address converting unit 1335 (S617).

After step S607, if it decides that the low density memory unit 111 already has a higher wearing rate than the high density memory unit 113 lasting for a period of time (S609), the range of valid blocks is reduced (S611), thereby reducing the data amount written into the low density memory unit 111 and increasing the data amount written into the high density memory unit 113, so as to balance the utility rate of both memories. Here, the lasting time described above can be a system default or a value set by user. If the judging result in step S603 is negative, then the writing data should be recorded into the low density memory unit 111, and before recording, it will judge that if the valid blocks have been reduced (S613). If not, the adapting unit 133 directly records the writing data into the low density memory unit 111 through the first address converting unit 1337 (S617), and if yes, the valid block range is gradually increased first for recording more writing data, and then the adapting unit 133 records the writing data into the low density memory unit 111 through the first address converting unit 1337 (S617).

In step S611, the data in the reduced valid block range should be erased. Here, if the data to be erased does not recorded in other unreduced valid blocks, the data is moved to the high density memory unit 113. Besides, when altering the valid block range, the addresses for storing the head pointer register 501 and the tail pointer register 502 are also adjusted, so that the range of the valid blocks can be correctly defined.

In the control method for the adaptive hybrid density memory storage device as described in FIG. 6, the adapting unit 133 can directly receive the writing data (S601) without the hot data filter unit 1331 judging the property thereof, and then judge the wearing rate of the non-volatile memory unit 11 (S603). The continuous steps are identical to FIG. 6.

Through the embodiments described above, it should be known that the adaptive hybrid density memory storage device and the control method thereof according to the present invention adjust the threshold, which is used for recognizing hot data, through analyzing the data length and constantly detecting the property of the writing data, so that the hot data can be recorded in the low density memory unit and the non-hot data can be recorded in the high density memory unit, thereby the characteristics of both memories can be sufficiently used for processing data, and the efficacy of the hybrid density memory storage device also can be effectively improved. Besides, the present invention also provides the method for processing data in non-volatile memory and the method for analyzing the wearing rate of both memories for controlling the life time of the memory, thereby the memory can be erased in a balanced way and the life time of the hybrid density memory storage device can be effectively increased.

It is to be understood, however, that even though numerous characteristics and advantages of the present application have been set forth in the foregoing description, together with details of the structure and function of the application, the disclosure is illustrative only, and changes may be made in detail, especially in matters of shape, size, and arrangement of parts within the principles of the application to the full extent indicated by the broad general meaning of the terms in which the appended claims are expressed.

What is claimed is:

1. A control method for storing a writing data into a hybrid density storage device, wherein the hybrid density storage device comprises a high density memory unit and a low density memory unit defining plural continuous blocks and a valid block range through a head pointer register and an tail pointer register for storing at least a valid data, and wherein an address stored in the head pointer register is directed to a block storing the newest valid data, and an address stored in the tail pointer register is directed to a block storing the oldest valid data, the control method comprising steps of:

executing a hot data filter procedure, wherein a data length of the writing data is compared with a threshold for recognizing a property of the writing data; and allocating the high density memory unit or the low density memory unit of the hybrid density storage device for the writing data according to the property of the writing data by executing an adapting procedure and a data processing procedure;

wherein the data processing procedure comprises redirecting the head pointer register to the block next to the block to which the head pointer register is previously directed, allocating the block to which the head pointer register is redirected for the writing data, erasing the valid data stored in the block directed by the tail pointer register, and redirecting the tail pointer register to the block next to the block to which the tail pointer register previously is directed, wherein the valid block range bounded by the head pointer register and the tail pointer register is fixed;

wherein when the writing data is categorized as a hot data as the data length of the writing data is less than the threshold allocates the low density memory unit for the hot data; otherwise, allocates the high density memory unit for the writing data that is categorized as a cold data when the data length of the writing data is larger than the threshold.

2. The control method as claimed in claim 1, wherein the adapting procedure is used to balance wearing rates of the hybrid density memory storage device, so that if the low density memory unit is associated with the higher wearing rate than the high density memory unit, allocating the high density memory unit for the writing data, otherwise, allocating the low density memory unit for the writing data.

3. The control method as claimed in claim 2, wherein the adapting procedure further comprises steps of:
reducing the valid block range if the low density memory unit has been associated with the higher wearing state than the high density memory unit for a predetermined period of time; and
erasing the valid data in the reduced valid blocks.

4. The control method as claimed in claim 3, wherein if the valid data to be erased is not recorded in other valid blocks, the valid data is moved to the high density memory unit.

5. The control method as claimed in claim 3, wherein the adapting procedure, prior to allocating the low density memory unit for the writing data, further comprises:
judging if the valid block range is reduced, and if yes increasing a range of the valid blocks.

6. The control method as claimed in claim 1, wherein the low density memory unit records the valid data through cyclically utilizing a storage space thereof.

7. A control method suitable for storing a writing data into a hybrid density storage device, wherein the hybrid density storage device comprises a high density memory unit and a low density memory unit, the method comprising steps of:
executing an adapting procedure, wherein a wearing rate of the lower density memory unit is compared with the a wearing rate of the high density memory unit for deciding an allocation of the lower density memory unit or the higher density memory unit for the writing data, after comparing a data length of a writing data with a threshold to determine a property of the writing data and allocating either the high density memory unit or the low density memory unit for the writing data depending on the property of the writing data; and
executing a data processing procedure, wherein the writing data is sequentially allocated into each block of a valid block range of the lower density memory unit or the higher density memory unit;
wherein the low density memory unit defines plural continuous blocks and the valid block range within the continuous blocks through a head pointer register and a tail pointer register and wherein an address stored in the head pointer register is directed to the block storing the newest valid data, and an address stored in the tail pointer register is directed to the block storing the oldest valid data;
wherein the data processing procedure comprises:
redirecting the head pointer register to the block next to the block to which the head pointer register is previously directed;
storing the writing data in the block to which the head pointer register is redirected;
erasing the valid data stored in the block directed by the tail pointer register; and
redirecting the tail pointer register to the block next to block to which the tail pointer register directed, wherein the valid block range bounded by the head pointer register and the tail pointer register is fixed.

8. The control method as claimed in claim 7, wherein the adapting procedure, if the low density memory unit has the higher wearing rate than the high density memory unit, allocates the high density memory unit for the writing data, otherwise, allocates the low density memory unit for the writing data.

9. The control method as claimed in claim 7, wherein the adapting procedure further comprises the steps of:
reducing the valid block range if the low density memory unit has been associated with the higher wearing state than the high density memory unit for a predetermined period of time; and
erasing the valid data in the reduced valid blocks.

10. The control method as claimed in claim 9 prior to allocating the low density memory unit for the writing data, further comprising:
judging if the valid block range is reduced, and if yes increasing a range of the valid blocks.

11. The control method as claimed in claim 7, wherein the data processing procedure further comprises:
recording the valid data to the high density memory unit if the valid data to be erased is not recorded in other valid blocks.

12. The control method as claimed in claim 7, wherein the low density memory unit records the valid data through cyclically utilizing a storage space thereof.

13. A hybrid density memory storage device suitable for storing writing data, wherein the hybrid density storage device comprises a low density memory unit, a high density memory unit and a control unit, defining plural continuous blocks and a valid block range through a head pointer register and an tail pointer register for storing at least a valid data, and wherein an address stored in the head pointer register is directed to a block storing the newest valid data, and an address stored in the tail pointer register is directed to a block storing the oldest valid data, and wherein the control unit comprises:
a hot data filter unit, for comparing a data length of the writing data with a threshold so as to determine a property of the writing data; and
an adapting unit, for receiving the writing data and allocating the high density memory unit or the low density memory unit of the hybrid density storage device for the writing data according to wearing rates of the high density memory unit and the low density memory unit and an amount of data processed by the low density memory unit with those of the high density memory unit by executing an adapting procedure and a data processing procedure;
wherein the data processing procedure comprises redirecting the head pointer register to the block next to the block to which the head pointer register is previously directed, allocating the block to which the head pointer register is redirected for the writing data, erasing the valid data stored in the block directed by the tail pointer register, and redirecting the tail pointer register to the block next to the block to which the tail pointer register previously is directed, wherein the valid block range bounded by the head pointer register and the tail pointer register is fixed;
wherein when the hot data filter unit categorizes the writing data as a hot data if the data length of the writing data is less than a threshold the adapting unit allocates the low density memory unit for the writing data; otherwise, the hot data filter categorizes the writing data as a cold data and the adapting unit allocate the high density memory unit for the writing data.

14. The hybrid density memory storage device as claimed in claim 13, wherein the threshold is according to an average of the data lengths of the writing data.

15. The hybrid density memory storage device as claimed in claim 13, wherein the control unit further comprises:
a system interface, for transmitting commands and data between a host and the hybrid density memory storage device;

a microprocessor, coupled to the system interface and the hot data filter unit, for transmitting the writing data to the hot data filter unit;

a data transmission buffer, coupled to the system interface, for temporarily storing the writing data; and a memory interface coupled between the data transmission buffer and the non-volatile memory unit and controlled by the microprocessor, for transmitting the writing data.

* * * * *